(12) United States Patent
Tsuchida et al.

(10) Patent No.: US 10,453,712 B2
(45) Date of Patent: Oct. 22, 2019

(54) HOLDING DEVICE

(71) Applicant: NGK SPARK PLUG CO., LTD., Nagoya, Aichi (JP)

(72) Inventors: Atsushi Tsuchida, Sendai (JP); Tetsuo Kitabayashi, Sendai (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 251 days.

(21) Appl. No.: 15/794,736

(22) Filed: Oct. 26, 2017

(65) Prior Publication Data
US 2018/0122659 A1    May 3, 2018

(30) Foreign Application Priority Data
Oct. 31, 2016 (JP) ................. 2016-212593

(51) Int. Cl.
*H01L 21/67* (2006.01)
*H01L 21/687* (2006.01)

(52) U.S. Cl.
CPC .. *H01L 21/67103* (2013.01); *H01L 21/68785* (2013.01)

(58) Field of Classification Search
CPC ......... H01L 21/67103; H01L 21/68785; B25B 5/082; B25B 5/101; B25B 1/20; B25B 5/02; B25B 5/04; B23Q 3/00; B23Q 2703/00; B23Q 2703/02
USPC ..... 374/141, 178–179; 269/293, 289 R, 290, 269/292
See application file for complete search history.

(56) References Cited

U.S. PATENT DOCUMENTS

| 4,821,674 A | * | 4/1989 | deBoer | B05C 11/08 118/641 |
| 5,356,486 A | * | 10/1994 | Sugarman | H01L 21/67248 136/230 |
| 5,830,277 A | * | 11/1998 | Johnsgard | C23C 16/481 118/725 |
| 2011/0005686 A1 | * | 1/2011 | Tanaka | H01L 21/68757 156/345.52 |
| 2012/0211933 A1 | * | 8/2012 | Goto | G01K 7/02 269/293 |
| 2018/0076067 A1 | * | 3/2018 | Kitabayashi | H01L 21/67248 |

FOREIGN PATENT DOCUMENTS

WO     2012/039453 A1     3/2012

* cited by examiner

*Primary Examiner* — Justin M Jonaitis
(74) *Attorney, Agent, or Firm* — Stites & Harbison, PLLC; Jeffrey A. Haeberlin; James R. Hayne

(57) ABSTRACT

A holding device includes: a plate-shaped base member defining a hole whose opening is formed at the lower face and extending toward an outer edge of the base member. A sheathed thermocouple is disposed in the hole. The hole has a first guide section that extends in a first direction, and a second guide section that extends in a second direction different from the first direction, through an intermediate guide section continuous with the first guide section, to a far end section of the hole, the sheathed thermocouple has an intermediate portion whose outer side surface is disposed closer to the opening with respect to the far end section of the hole. The outer side surface is in contact with an inner wall surface of the intermediate guide section. An end portion of the sheathed thermocouple is in contact with the far end section of the hole.

4 Claims, 1 Drawing Sheet

HOLDING DEVICE

CROSS REFERENCE TO RELATED APPLICATION

The present application claims priority to Japanese Patent Application No. 2016-212593, which was filed on Oct. 31, 2016, the disclosure of which is herein incorporated by reference in its entirety.

BACKGROUND OF THE INVENTION

Field of the Invention

The present invention relates to a holding device that holds an object such as a wafer for semiconductor production.

Background of Related Art

To date, a holding device that includes: a base member having an upper face for holding an object such as a wafer for semiconductor production; a hole formed inside the base member; and a thermocouple that is inserted in the hole, has been known (see, for example, Patent Document 1).

RELATED ART DOCUMENT

Patent Document 1 is International Publication No. 2012/039453.

BRIEF SUMMARY OF THE INVENTION

The holding device is required to allow a temperature to be stably measured by the front end portion of the thermocouple being in contact with an inner surface of a far end section of the hole if the thermocouple expands or contracts due to heat.

The present invention is made in view of the aforementioned circumstances, and an object of the present invention is to provide a holding device that allows a temperature of a base member to be measured more stably than conventional art.

[1] In order to attain the aforementioned object, the present invention is directed to a holding device including:

a plate-shaped base member formed from a ceramic sintered body and having an upper face on which an object is to be held and a lower face disposed opposite to the upper face; and the plate-shaped base member including therein a hole whose opening is formed at the lower face, the hole extending toward an outer edge of the base member, wherein a sheathed thermocouple having a thermocouple contained in a sheath is disposed in the hole, when the hole is projected from the upper face toward the lower face, the hole is composed of a first guide section that extends in a first direction, an intermediate guide section continuous with the first guide section, and a second guide section that extends to a far end section of the hole through the intermediate guide section in a second direction different from the first direction, the sheathed thermocouple has an intermediate portion disposed closer to the opening with respect to the far end section of the hole, the intermediate portion whose outer surface is in contact with an inner wall surface of the intermediate guide section, and an end portion of the sheathed thermocouple is in contact with the far end section of the hole.

In other words, the present invention is directed to a holding device including a plate-shaped base member and a sheathed thermocouple. The plate-shaped base member is formed from a ceramic sintered body having an upper face on which an object is to be held, a lower face disposed opposite to the upper face, and an outer edge. The plate-shaped base member defines a hole having an opening at the lower face, the hole extending toward the outer edge, and, when the hole is projected from the upper face toward the lower face, the hole includes a first guide section extending in a first direction, an intermediate guide section continuous with the first guide section, and a second guide section connected to the first guide section through the intermediate guide section, the second guide section extending to a far end section of the hole in a second direction different from the first direction. The sheathed thermocouple includes a thermocouple contained in a sheath, and the sheathed thermocouple is disposed in the hole with an end portion of the sheathed thermocouple in contact with the far end section of the hole and an intermediate portion of the sheathed thermocouple disposed closer to the opening of the hole than the far end section of the hole. The intermediate portion has an outer surface in contact with an inner wall surface of the intermediate guide section of the hole.

According to the present invention, the end portion of the sheathed thermocouple is in contact with the far end section of the hole, and the outer side surface of the intermediate portion of the sheathed thermocouple is in contact with the inner wall surface of the intermediate guide section. Therefore, the end portion of the sheathed thermocouple is prevented from being unstable, and a temperature can be stably measured by the sheathed thermocouple.

[2] Further, according to the present invention, the first direction and the second direction are preferably coplanar with each other along the upper face (i.e., substantially parallel to the upper face). In this configuration, influence of thermal distribution from the upper face of the base member to the lower face thereof can be reduced, and a temperature can be stably measured by the sheathed thermocouple.

[3] Further, according to the present invention, when the hole is projected from the upper face toward the lower face, the intermediate guide section is closer to the far end section of the hole with respect to the opening (i.e., closer to the far end section of the hole than the opening of the hole). In this configuration, a distance between the two points with which the sheathed thermocouple is in contact can be shortened, so that the sheathed thermocouple can be more stably disposed, and a temperature can be more appropriately measured.

[4] Further, according to the present invention, at least one of the first guide section and the second guide section curvedly extends. In this configuration, the sheathed thermocouple can be smoothly inserted into the hole, and the holding device can be easily manufactured.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

Figure 1:
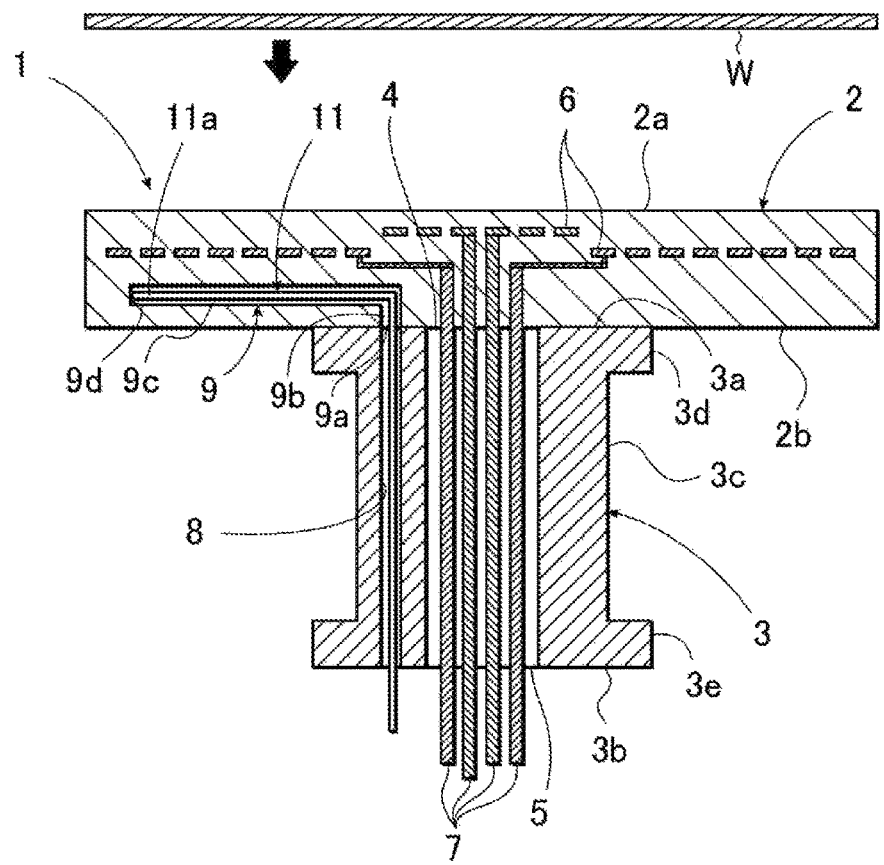
FIG. 1 is a view showing a holding device according to an embodiment of the present invention.

A holding device according to an embodiment of the present invention will be described with reference to the drawings. As shown in FIG. 1, a holding device 1 of the present embodiment includes a base member 2 and a tubular support member 3. The base member 2 is formed from a material obtained by yttrium oxide ($Y_2O_3$) being added to aluminium nitride (AlN), and has the diameter of 350 mm and the thickness of 25 mm. The base member 2 includes: an upper face 2a on which a wafer W as an object is to hold; and a lower face 2b disposed on a side opposite to the upper face 2a side. The tubular support member 3 has a cylindrical shape that has one end face 3a, the other end face 3b, and a smooth circumferential face 3c. The tubular support member 3 may be formed so as to have the outer diameter of 65 mm, the inner diameter of 45 mm, and the height of 200 mm. The tubular support member 3 may be formed so as to have a polygonal tubular shape.

The tubular support member 3 is formed in a hollow. The one end face 3a and the other end face 3b have opening ends 4 and 5, respectively. The tubular support member 3 has flanges 3d, 3e that extend radially outward, on both end portions thereof, over the entirety of the circumference. The opening end 4 formed at the one end face 3a of the tubular support member 3 is connected to the lower face 2b of the base member 2.

In the base member 2, heat generation resistors 6 made of molybdenum (Mo) are embedded. Rod-shaped wiring 7 for supplying power to the heat generation resistors 6 is connected to the heat generation resistors 6 through the tubular support member 3.

Inside a circumferential wall of the tubular support member 3, a support member side passage 8 having the diameter of 3 mm is formed so as to extend in a direction (axial direction of the tubular support member 3) from the other end face 3b toward the one end face 3a.

A hole 9 is formed in the base member 2 so as to communicate with the support member side passage 8. The hole 9 is composed of: an opening 9a that is open at the lower face 2b of the base member 2; a vertical hole 9b that extends from the opening 9a toward the upper face; and a horizontal hole 9c that extends from the upper end of the vertical hole 9b toward the radially outer side (in the outer edge direction) of the base member 2.

The horizontal hole 9c includes: a first guide section 12 that connects to the vertical hole 9b and that extends radially outward; and a second guide section 14 that is connected to the first guide section 12 through an intermediate guide section 13.

The second guide section 14 extends so as to be bent by 30° relative to the direction in which the first guide section 12 extends. In the present embodiment, an extending direction of the first guide section 12 that extends radially outward corresponds to a first direction of the present invention, and an extending direction of the second guide section 14 that is tilted by 30° relative to the first direction corresponds to a second direction.

Further, the first guide section 12, the intermediate guide section 13, and the second guide section 14 are disposed so as to be coplanar with each other. More specifically, the base member 2 is formed by two ceramic plates being stacked, and a groove that is bent so as to correspond to the first guide section 12, the intermediate guide section 13, and the second guide section 14 is formed in a stacking side surface of one of the ceramic plates. By the two ceramic plates being stacked and joined to each other, the first guide section 12, the intermediate guide section 13, and the second guide section 14 are defined by the groove in the one of the ceramic plates and a stacking side surface of the other of the ceramic plates.

Figure 2:
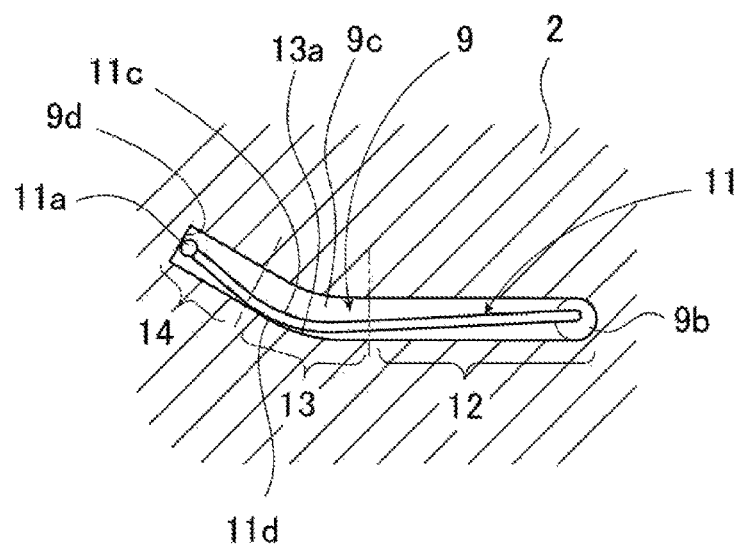
FIG. 2 is a plan view showing, in an enlarged manner, a cross-section of a part of the holding device according to the present embodiment.

As shown in FIG. 2, a sheathed thermocouple 11 is inserted in the hole 9. The sheathed thermocouple 11 is structured by wires of a type K thermocouple being covered with a sheath made of SUS316L. The sheathed thermocouple 11 is inserted in the hole 9 such that an end portion 11a of the sheathed thermocouple 11 is in contact with a far end section inner surface 9d of the hole 9 while an outer side surface 11d of an intermediate portion 11c of the sheathed thermocouple 11 is in contact with an inner wall surface 13a of the intermediate guide section 13.

In the holding device 1 of the present embodiment, the end portion 11a of the sheathed thermocouple 11 is in contact with the far end section inner surface 9d of the hole 9, and the outer side surface 11d of the intermediate portion 11c of the sheathed thermocouple 11 is in contact with the inner wall surface 13a of the intermediate guide section 13. Therefore, the sheathed thermocouple 11 is in contact with the hole 9 at two portions, and a restoring force acts on the sheathed thermocouple 11 that is elastically deformed, whereby the end portion 11a of the sheathed thermocouple 11 is prevented from being unstable, and a temperature can be stably measured by the sheathed thermocouple 11.

Further, in the present embodiment, when a projection of the hole 9 is made from the upper face 2a toward the lower face 2b, the intermediate guide section 13 is positioned so as to be closer to the far end section inner surface 9d of the hole 9 than to the opening 9a. Thus, a distance between the two points at which the sheathed thermocouple 11 is in contact with the hole 9 can be shortened, and the end portion 11a of the sheathed thermocouple 11 can be inhibited from being unstable and can be stably disposed, so that a temperature can be more appropriately measured.

In the present embodiment, the first guide section 12 and the second guide section 14 linearly extend. However, the first guide section and the second guide section of the present invention are not limited thereto. For example, one or both thereof may be bent. By the bending, the sheathed thermocouple can be smoothly inserted into a hole.

Further, in the present embodiment, the intermediate guide section 13 is gently bent. However, the intermediate guide section of the present invention may be shaped so as to be sharply bent. Also in this case, the effect of the present invention that the sheathed thermocouple is in contact with the hole at two portions, and the end portion of the sheathed thermocouple is prevented from being unstable, and a temperature can be stably measured by the sheathed thermocouple can be obtained.

Further, in the present embodiment, when a projection of the hole 9 is made from the upper face 2a toward the lower face 2b, the far end section inner surface 9d of the hole 9 has a smooth flat surface. However, for example, the far end section inner surface 9d of the hole 9 may be tapered so as to have an angular portion formed by two flat surfaces being bent at mid-portions thereof and being continuous. In this case, the end portion 11a of the sheathed thermocouple 11 is held by the tapered far end section of the hole 9 so that the end portion 11a of the sheathed thermocouple 11 can be more assuredly prevented from being unstable.

Further, in the present invention, the end portion of the sheathed thermocouple being in contact with the far end section of the hole not only means that the end portion of the sheathed thermocouple and the far end section of the hole are directly in contact with each other, but also includes an "indirect contact" that the end portion of the sheathed thermocouple is in contact with the far end section of the hole through another member such as a heat conductive protective layer or a heat conductive adhesive. The same applies to the outer side surface of the intermediate portion of the sheathed thermocouple being in contact with the inner wall surface of the intermediate guide section.

DESCRIPTION OF REFERENCE NUMERALS

1: holding device
2: base member
2a: upper face
2b: lower face
3: tubular support member
3a: one end face
3b: the other end face
3c: circumferential face
3d, 3e: flange
4, 5: opening end
6: heat generation resistor
7: wiring
8: support member side passage
9: hole
9a: opening
9b: vertical hole
9c: horizontal hole
9d: far end section inner surface
11: sheathed thermocouple
11a: end portion
11c: intermediate portion
11d: outer side surface
12: first guide section
13: intermediate guide section
13a: inner wall surface
14: second guide section
W: wafer (object)

What is claimed is:

1. A holding device comprising:
a plate-shaped base member formed from a ceramic sintered body and having an upper face on which an object is to be held, a lower face disposed opposite to the upper face, and an outer edge, the plate-shaped base member defining a hole opening at the lower face, the hole extending toward the outer edge, and, when the hole is projected from the upper face toward the lower face, the hole includes a first guide section extending in a first direction, an intermediate guide section continuous with the first guide section, and a second guide section connected to the first guide section through the intermediate guide section, the second guide section extending to a far end section of the hole in a second direction different from the first direction, and
a sheathed thermocouple including a thermocouple contained in a sheath, the sheathed thermocouple disposed in the hole with an end portion of the sheathed thermocouple in contact with the far end section of the hole and an intermediate portion of the sheathed thermocouple disposed closer to the opening of the hole than the far end section of the hole, the intermediate portion having an outer surface in contact with an inner wall surface of the intermediate guide section of the hole.

2. A holding device according to claim 1, wherein the first direction and the second direction are coplanar with each other and substantially parallel to the upper face.

3. A holding device according to claim 1, wherein, when the hole is projected from the upper face toward the lower face, the intermediate guide section is closer to the far end section of the hole than the opening of the hole.

4. A holding device according to claim 1, wherein at least one of the first guide section and the second guide section extends curvedly.

* * * * *